(12) United States Patent
Pichler

(10) Patent No.: US 6,342,424 B1
(45) Date of Patent: Jan. 29, 2002

(54) HIGH-Q SPIRAL INDUCTOR STRUCTURE AND METHODS OF MANUFACTURING THE STRUCTURE

(75) Inventor: Christoph Pichler, San Francisco, CA (US)

(73) Assignee: National Semiconductor Corp., Santa Clara, CA (US)

( * ) Notice: Subject to any disclaimer, the term of this patent is extended or adjusted under 35 U.S.C. 154(b) by 0 days.

(21) Appl. No.: 09/828,546

(22) Filed: Apr. 6, 2001

(51) Int. Cl.[7] ................................ H01L 21/20
(52) U.S. Cl. ..................... 438/381; 257/421
(58) Field of Search ............... 438/381, 238, 438/619, 800; 257/531, 108, 422, 423–425, 798, 421

(56) References Cited

U.S. PATENT DOCUMENTS 5,936,299 A * 8/1999 Burghartz et al. .......... 257/531
6,187,647 B1 * 2/2001 Chu ............................. 438/381

* cited by examiner

*Primary Examiner*—Charles Bowers
*Assistant Examiner*—Craig Thompson
(74) *Attorney, Agent, or Firm*—Stallman & Pollock LLP

(57) ABSTRACT

A high-Q spiral inductor structure that utilizes a three-layer substrate, and methods of manufacturing the structure, are provided. The three-layer substrate is utilizable for CMOS circuits while at the same time minimizing eddy current induction and increasing the inductor quality factor Q of the structure.

4 Claims, 3 Drawing Sheets

HIGH-Q SPIRAL INDUCTOR STRUCTURE AND METHODS OF MANUFACTURING THE STRUCTURE

BACKGROUND OF THE INVENTION

1. Field of the Invention

The present invention relates to semiconductor integrated circuits and, in particular, to a high-Q spiral inductor structure obtained through a low-loss underlying doping profile and to methods of manufacturing the high-Q spiral inductor structure.

2. Discussion of the Related Art

FIG. 1A shows a plan view of a typical spiral inductor structure 100. FIG. 1B is a cross-section view of the FIG. 1A structure taken along line A—A in FIG. 1A.

The illustrated spiral inductor structure 100 includes a metal strip 102, usually aluminum or copper, that is patterned in a generally serpentine configuration. The coils of the metal strip 102 are separated from one another, and from the underlying silicon substrate 104 (see FIG. 1B), by surrounding dielectric material 106, typically silicon dioxide. The spiral inductor metal strip 102 includes a pad region 102a that provides for electrical connection to the strip 102. The strip 102 may also be connected to other conductive elements in the overall integrated circuit structure of which the inductor is a part, such as, for example, the lower conductive layer 108 shown in FIG. 1B; in the FIG. 1B structure, the inductor coil strip 102 is connected to the lower conductive layer 108 by vias 110. As further shown in FIG. 1B, the underlying substrate 104 usually comprises a layer of bulk silicon 112 with a layer of epitaxial silicon 114 formed on the bulk silicon 112.

As illustrated by the solid line 116 in FIG. 1B, the dopant profile in the silicon substrate 104 includes a first dopant concentration in the epitaxial silicon 114 that is less than a second dopant concentration of the underlying bulk silicon 112.

Conventionally, conflict arises in the realization of high quality-factor (Q) spiral inductors in a complementary-metal-oxide-semiconductor (CMOS) process flow due to the high level of dopant used in the underlying bulk silicon 112, situated underneath the epitaxial layer 114. The higher dopant concentration in the bulk silicon 112 results in a significant eddy current induced from the overlying inductor 102.

SUMMARY OF THE INVENTION

The present invention relates to improved compatibility between a standard, high density CMOS process and a high performance wireless process that realizes high-Q spiral inductors.

A high-Q spiral inductor structure in accordance with the present invention utilizes a three-layer substrate. The three-layer substrate is utilizable for CMOS circuits while at the same time minimizes eddy current induction and increases the inductor quality factor Q.

A spiral inductor structure in accordance with the present invention includes a lower layer of semiconductor material that has a first dopant concentration. An intermediate layer of semiconductor material above the lower layer has a second dopant concentration that is greater than the first dopant concentration. An upper layer of semiconductor material above the intermediate layer has a third dopant concentration that is substantially the same as the first dopant concentration. A spiral inductor is formed above the upper layer and is insulated from the upper layer by dielectric material.

The features and advantages of the present invention will be more fully appreciated upon consideration of the following detailed description of the invention and the accompanying drawings.

DETAILED DESCRIPTION OF THE INVENTION

Figure 1A:
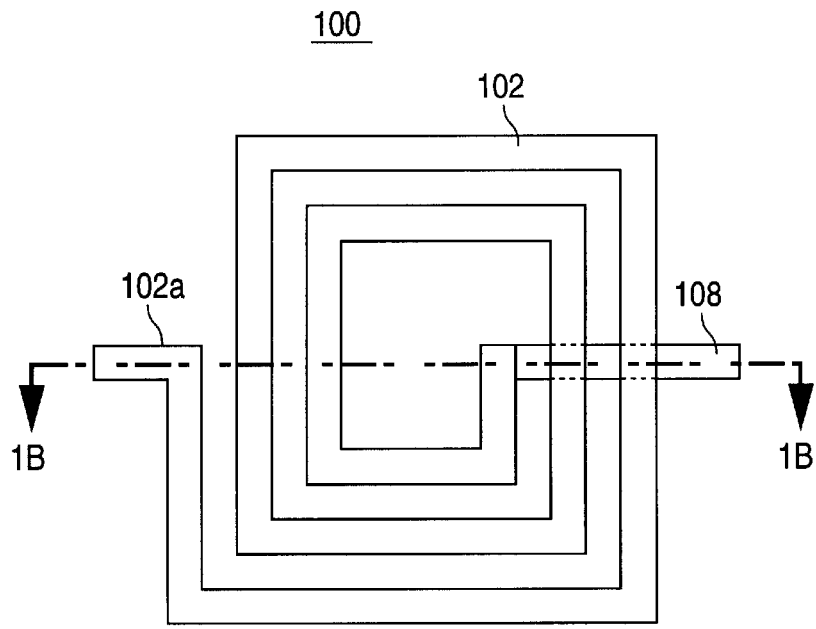
FIGS. 1A and 1B illustrate a conventional spiral inductor structure and its associated substrate dopant concentration profile.
Figure 1B:
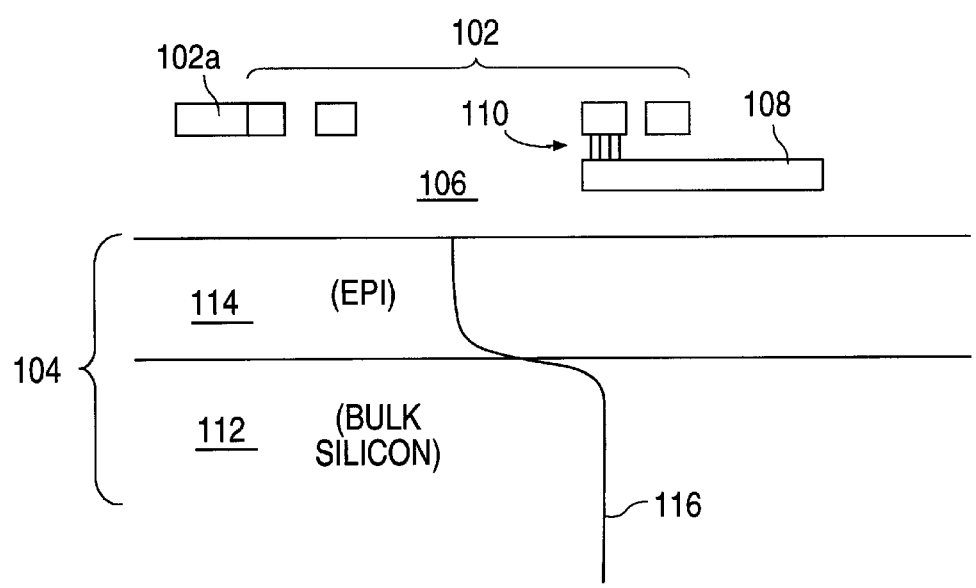
Figure 2:
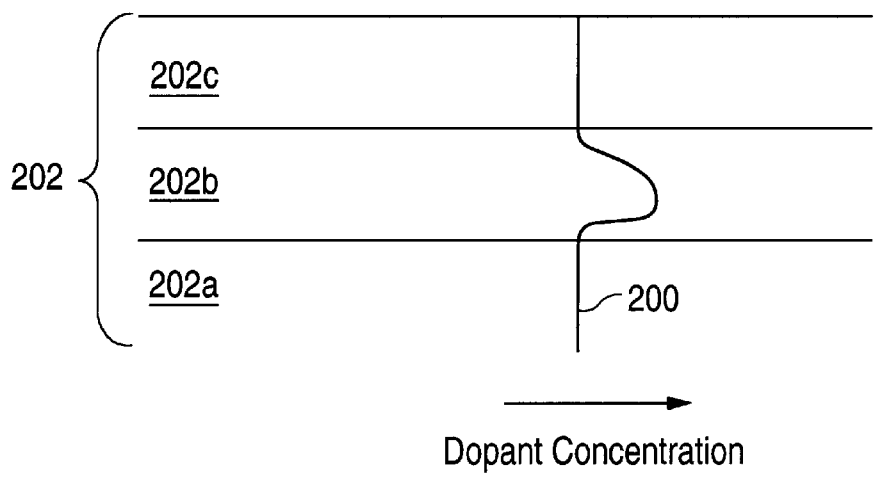
FIG. 2 illustrates a three-layer substrate utilized in a spiral inductor structure in accordance with the present invention and an associated dopant concentration profile of the three-layer substrate.

FIG. 2 shows a three-layer substrate 202 for a high-Q spiral inductor structure in accordance with the present invention. The dopant concentration profile of the substrate 202 is shown by the solid line 200 in FIG. 2. As shown in FIG. 2, the three-layer substrate 202 includes a lower bulk silicon layer 202a having a first dopant concentration, a second, intermediate layer of silicon 202b having a second dopant concentration that is greater than the first dopant concentration, and a third upper layer of silicon 202c having a third dopant concentration that is substantially the same as the first dopant concentration. An electrically-insulated spiral inductor structure (not shown in FIG. 2), is formed above the three-layer substrate 202 utilizing well-known techniques. Acceptable dopant concentration ranges for the three-layer substrate 200 are as follows: lower bulk silicon layer 202a, 5e14–2e15; intermediate silicon layer 202b, 1e18–1e19; and upper silicon layer 202c, 5e14–2e15. Those skilled in the art will, of course, appreciate that structures in accordance with the invention can be built using either N-type dopant or P-type dopant.

Figure 3A:
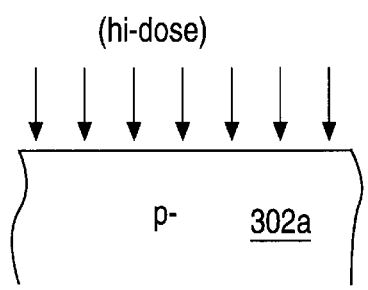
FIGS. 3A–3C illustrate the steps of manufacturing a high-Q spiral inductor structure utilizing a three-layer substrate utilizing a method in accordance with the concepts of the present invention.
Figure 3B:
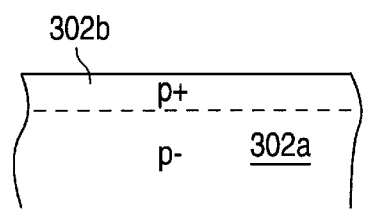
Figure 3C:
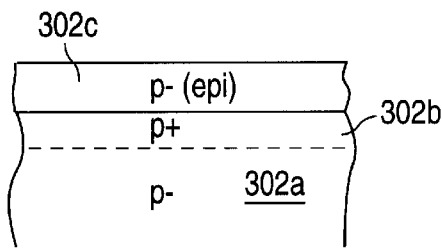

FIGS. 3A–3C illustrate the steps of a first method of fabricating a three-layer substrate, spiral inductor structure in accordance with the concepts of the present invention. As shown in FIG. 3A, this first method begins with a bulk silicon substrate 302a having p− conductivity. A high dose of p-type dopant is then introduced into the upper surface region of the p− bulk silicon 302a, typically utilizing ion implantation, to form a region 302b in the bulk silicon that has a higher p-type dopant concentration (p+) than the p− dopant concentration of the bulk silicon 302a. To complete the three-layer substrate structure, an upper layer of epitaxial silicon 302c having substantially the p− dopant concentration is formed on the upper surface of the bulk silicon, resulting in the structure showing in FIG. 3C. The structure is completed by fabricating an electrically insulated spiral inductor structure above the epitaxial layer 302c utilizing well-known techniques.

Figure 4A:
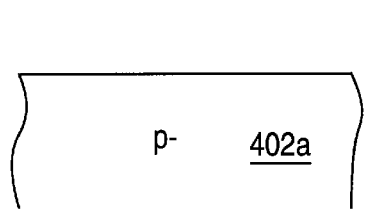
FIGS. 4A–4C illustrate the steps of manufacturing a high-Q spiral inductor structure that utilizes a three-layer substrate utilizing an alternate method in accordance with the present invention.
Figure 4B:
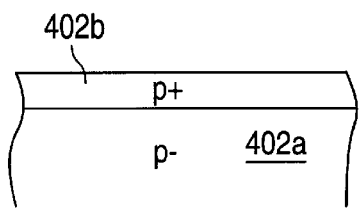
Figure 4C:
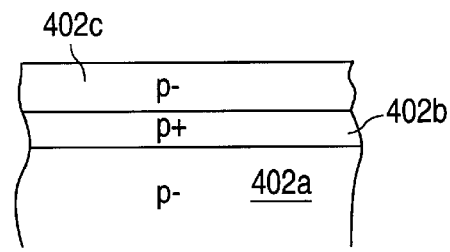

FIGS. 4A–4C illustrate the steps of a second method of fabricating a three-layer substrate, spiral inductor structure in accordance with the concepts of the present invention. As shown in FIG. 4A, a second method begins with a bulk silicon substrate 402a having a p– dopant concentration. A first epitaxial layer 402b having a p+ dopant concentration that is greater than the p– dopant concentration is then formed over the bulk silicon substrate 402a such that the p+ epitaxial layer 402b has a dopant concentration that is greater than the dopant concentration of the underlying p– bulk silicon 402a. Next, a second layer 402c of epitaxial silicon is formed on the first layer 402b of epitaxial silicon; the second epitaxial silicon layer 402c has a p– dopant concentration, i.e. a dopant concentration that is substantially the same as that of the bulk silicon 402a. An electrically insulated, spiral inductor structure is then formed above the second epitaxial silicon layer 402c in accordance with well-known techniques.

Figure 5A:
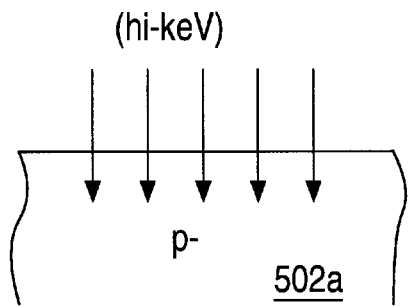
FIGS. 5A and 5B illustrate the steps of manufacturing a high-Q spiral inductor that utilizes a three-layer substrate utilizing a second alternate method in accordance with the present invention.
Figure 5B:
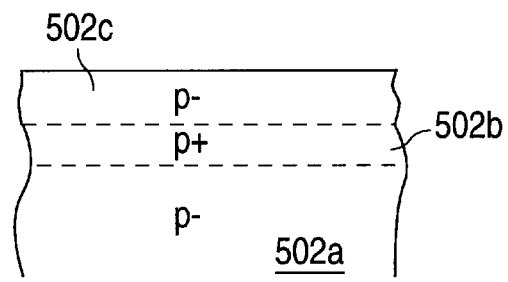

FIGS. 5A–5C illustrate the steps of the third method for fabricating a three-layer substrate, spiral inductor structure in accordance with the present invention. As shown in FIG. 5A, this third method begins with a p– bulk silicon substrate 502a. P-type dopant is then introduced into the p– bulk silicon using a high energy ion implant (e.g., implant energy for boron is about 3.5 MeV) such that a region of p+ dopant 502b, i.e. a region that has a dopant concentration that is greater than that of the bulk silicon 502a, is formed at a depth below the upper surface of the bulk silicon 502a. The result is formation of a three-layer structure in the p– bulk silicon such that a p+ region 502b is "sandwiched" between two p– regions (502a and 502c) of silicon that have a dopant concentration that is less than the p+ region 5–2b. An electrically insulated, conductive spiral inductor structure is then formed over the upper surface of the p– silicon utilizing well-known techniques.

Given the above detailed description of the invention and the embodiments of the invention described therein, it is intended that the following claims define the scope of the invention and that structures and methods within the scope of these claims and their equivalents be covered thereby.

What is claimed is:

1. A spiral inductor structure comprising:

a lower layer of semiconductor material having a first dopant concentration;

an intermediate layer of semiconductor material formed above the lower layer and having a second dopant concentration greater than the first dopant concentration;

an upper layer of semiconductor material formed above the intermediate layer and having a third dopant concentration that is substantially the same as the first dopant concentration; and a spiral inductor formed above the upper layer and insulated therefrom by dielectric material.

2. A method of fabricating a spiral inductor structure, the method comprising:

introducing p-type dopant into the upper surface region of a bulk silicon substrate having a first dopant concentration such that the upper surface region has a second dopant concentration that is greater than the first dopant concentration;

forming an epitaxial silicon layer above the upper surface region of the bulk silicon substrate, the epitaxial layer having a dopant concentration that is substantially the same as the lower region of the bulk silicon material; and forming a spiral inductor above the epitaxial layer and insulated from the epitaxial layer by dielectric material.

3. A method of forming a spiral inductor structure, the method comprising:

forming a p+ epitaxial layer on an underlying p– layer of bulk silicon such that the p+ epitaxial layer has a dopant concentration that is greater than the dopant concentration of the bulk silicon;

forming a second epitaxial layer on the first epitaxial layer, the second epitaxial layer having a dopant concentration that is substantionally the same as the dopant concentration of the bulk silicon; and, forming a spiral inductor structure above the second epitaxial layer and insulated from the second epitaxial layer by dielectric material.

4. A method of forming a spiral inductor structure, the method comprising:

introducing p-type dopant into a p– bulk silicon substrate utilizing a high energy implant such that the introduction of the p-type dopant results in the formation of a p+ region of silicon beneath the surface of the bulk silicon material, the p+ region having a higher dopant concentration than the dopant concentration of the underlying p– bulk silicon and a dopant concentration greater than the overlying p– region of the bulk silicon material, the upper and lower regions of p– silicon having substantially the same dopant concentration level; and forming a spiral inductor above the upper region of bulk silicon material and insulated from the upper region of the bulk silicon material by dielectric material.

* * * * *